United States Patent
Wu et al.

(10) Patent No.: US 8,541,288 B2
(45) Date of Patent: Sep. 24, 2013

(54) MANUFACTURING METHOD OF THIN FILM TRANSISTOR ARRAY SUBSTRATE

(71) Applicant: Chunghwa Picture Tubes, Ltd., Taoyuan (TW)

(72) Inventors: Der-Chun Wu, New Taipei (TW); Yu-Hsien Chen, Kaohsiung (TW); Sheng-Fa Liu, Hsinchu County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 0 days.

(21) Appl. No.: 13/775,270

(22) Filed: Feb. 25, 2013

(65) Prior Publication Data
US 2013/0164908 A1 Jun. 27, 2013

Related U.S. Application Data

(62) Division of application No. 13/080,695, filed on Apr. 6, 2011, now Pat. No. 8,405,234.

(30) Foreign Application Priority Data

Jan. 28, 2011 (TW) .............................. 100103313 A

(51) Int. Cl.
*H01L 23/544* (2006.01)
(52) U.S. Cl.
USPC ........................................ 438/462; 257/797

(58) Field of Classification Search
USPC ................. 438/701, 978, 427, 462; 257/623, 257/797, E21.324, E21.454
See application file for complete search history.

(56) References Cited

U.S. PATENT DOCUMENTS 8,405,234 B2 * 3/2013 Wu et al. ........................ 257/797
2007/0058112 A1 * 3/2007 Li et al. .......................... 349/106

FOREIGN PATENT DOCUMENTS

| JP | 2818374 | 8/1998 |
| JP | 2828990 | 9/1998 |
| TW | 200717093 | 5/2007 |

* cited by examiner

*Primary Examiner* — Calvin Lee
(74) *Attorney, Agent, or Firm* — Winston Hsu; Scott Margo

(57) ABSTRACT

A manufacturing method for a TFT array substrate includes providing a substrate; defining a plurality of normal alignment regions and a plurality of abnormal alignment regions on the substrate; forming an insulating layer and a transparent conductive layer on the substrate; performing a patterning process to at least one of the insulating layer and the transparent conductive layer to form a plurality of alignment structures in each abnormal alignment region; forming an alignment material layer on the substrate, the alignment material layer having a plurality of first alignment slits formed along the alignment structures in each of the abnormal alignment regions; and performing a rubbing alignment process to form a plurality of second alignment slits on the alignment material layer in each of the normal alignment regions along a alignment direction.

11 Claims, 10 Drawing Sheets

MANUFACTURING METHOD OF THIN FILM TRANSISTOR ARRAY SUBSTRATE

CROSS REFERENCE TO RELATED APPLICATIONS

This application is a divisional of application Ser. No. 13/080,695 filed Apr. 6, 2011.

BACKGROUND OF THE INVENTION

1. Field of the Invention

The present invention is related to a thin film transistor (TFT) array substrate and a manufacturing method thereof, and more particularly, to a TFT array substrate and a manufacturing method thereof that is capable of solving the abnormal alignment problem.

2. Description of the Prior Art

Liquid crystal displays (LCD) are widely used in mobile device such as mobile phones and digital cameras, personal computers, notebook computers, and home appliance. A conventional LCD panel includes a TFT array substrate, a color filter substrate opposite to the TFT array substrate, and a liquid crystal (LC) layer sandwiched in between the TFT array substrate and the color filter substrate. It is well-known to those skilled in the art that an alignment layer is respectively formed on the surface of the TFT array substrate that facing the LC layer and on the surface of the color filter substrate that facing the LC layer. The alignment layers are formed to uniformly maintain an initial alignment of the LC layer so that the LC molecules in the LC layer are oriented to a specific and predetermined arrangement.

Please refer to FIG. 1, which is a schematic drawing illustrating a conventional TFT array substrate of a twisted nematic (TN) LCD. As shown in FIG. 1, the conventional TFT array substrate 100 includes a substrate 101 having scan lines 102, data lines 104, and storage electrode lines 106 formed thereon. The scan lines 102 and the data lines 104 define pixel regions 108. And the TFT array substrate 100 also includes switch devices 110 respectively positioned in each pixel region 108. Of course, those of ordinary skill in the art will recognize that after forming the abovementioned lines and switch devices 110, an alignment material layer (not shown) is formed to cover the TFT array substrate 100. Then the alignment material layer is rubbed by use of a rubbing roll to form uniform microgrooves on the surface of the alignment material layer. Accordingly an alignment layer having a plurality of uniform microgrooves is obtained. The formed microgrooves exhibit a particularly high surface anchoring energy and yield a strong alignment to the LC molecules, and thus the LC molecules in the LC layer are arranged in the predetermined direction.

Please still refer to FIG. 1. It is well-known to those skilled in the art that when rubbing the alignment material layer, the rubbing roll moves along an alignment direction 120. For example, the conventional TFT array substrate 100 of the TN LCD apparatus has an included angle of 45° between the alignment direction 120 and the scan lines 102 or the data lines 104. Subsequent to the rubbing, a plurality of normal alignment regions 130 is obtained. The normal alignment regions 130 mainly are formed at a windward side 102a of the scan line 102, a windward side 106a of the storage electrode line 106, a windward side 104a of the data line 104, and a windward side 110a of the switch device 110. However, since the scan lines 102, the data lines 104, the storage electrode lines 106, and the switch devices 110 are protruded from the surface of the substrate 101, abnormal alignment regions 140 are formed at a leeward side 102b of the scan line 102, a leeward side 104b of the data line 104, a leeward side 106b of the storage electrode line 106 and a leeward side 110b of the switch device 110. In the abnormal alignment regions 140, the microgrooves that provide anchoring energy are not formed. As shown in FIG. 1, the abnormal alignment regions 140 are formed at where perpendicular to the first component direction 120a of the alignment direction 120, specifically, at the leeward side 104b of the data line 104 and the leeward side 110b of the switch devices 110. In the same concept, the abnormal alignment regions 140 are formed at where perpendicular to the second component direction 120b of the alignment direction 120, specifically, at the leeward side 102b of the scan line 102 and the leeward side 106b of the storage electrode line 106. Briefly speaking, when rubbing the alignment material layer, the abnormal alignment regions 140 are always formed on the TFT array substrate 100 at the leeward sides 102b/104b/106b/110b of the elements corresponding to the alignment direction 120.

As mentioned above, since the microgrooves that provide anchoring energy are not formed in the abnormal alignment regions 140, the LC molecules cannot be oriented to the predetermined direction, and thus the LC molecules are disarranged in the abnormal alignment regions 140. Consequently, dark regions are observed in the abnormal alignment regions 140 when the LCD is turned on while light leakage is observed in the abnormal alignment regions 140 when the LCD is turned off. Furthermore, the disarranged LC molecules in the abnormal alignment regions 140 render adverse impact to the rotation of the LC molecules in the normal alignment regions 130, and thus the response time of the LCD panel is prolonged and the performance of the LCD is deteriorated. As a countermeasure against to the problem, the prior art developed to position the black matrix corresponding to the abnormal alignment regions 140. However, this approach suffers lowered aperture ratio.

SUMMARY OF THE INVENTION

Therefore the present invention provides a TFT array substrate and a manufacturing thereof that is able to solve the problem that the LC molecules are disarranged in the abnormal alignment regions due to the rubbing alignment.

According to an aspect of the present invention, a manufacturing method for a TFT array substrate is provided. The manufacturing method includes providing a substrate having a plurality of scan lines, a plurality of data lines, a plurality of storage electrode lines, and a plurality of switch devices formed thereon; defining a plurality of normal alignment regions and a plurality of abnormal alignment regions on the substrate; wherein the normal alignment regions are defined at sides of the scan lines, the data lines, the storage electrode line, and the switch devices, and the abnormal alignment regions are defined at opposite sides of the scan lines, the data lines, the storage electrode lines, and the switch devices; forming an insulating layer and a transparent conductive layer on the substrate, sequentially; performing a patterning process to at least one of the insulating layer and the transparent conductive layer to form a plurality of alignment structures in each abnormal alignment region; forming an alignment material layer on the substrate, the alignment material layer having a plurality of first alignment slits formed along the alignment structures in each of the abnormal alignment regions; and performing a rubbing alignment process to form a plurality of second alignment slits on the alignment material layer in each of the normal alignment regions along a alignment direction.

According to another aspect of the present invention, a TFT array substrate is provided. The TFT array substrate includes a substrate having a plurality of normal alignment regions, a plurality of abnormal alignment regions, and a device region defined thereon; a plurality of scan lines, a plurality of data lines, a plurality of storage electrode lines, and a plurality of the switch devices positioned on the substrate in the device region; a plurality of alignment structures positioned in the abnormal alignment regions; and an alignment layer formed on the substrate and the alignment structures. The alignment layer further comprising a plurality of first alignment slits covering the alignment structures in the abnormal alignment regions and a plurality of second alignment slits in the normal alignment regions, a depth and a width of the second alignment slits are equal to a depth and a width of the first alignment slits.

According to the TFT array substrate and the manufacturing method thereof provided by the present invention, the abnormal alignment regions and the normal alignment regions are particularly defined on the substrate corresponding to an alignment direction, and the alignment structures are particularly formed in the insulating layer or the transparent conductive layer in the abnormal alignment regions by the patterning process. Therefore, the alignment material layer spontaneously obtains the first alignment slits formed along the alignment structures in the abnormal alignment regions while the second alignment slits are formed in the alignment material layer in the normal alignment regions by performing the rubbing alignment process. And the depths and the widths of the first alignment slits and the second alignment slits are the same. Accordingly the TFT array substrate and the manufacturing method thereof provided by the present invention solve the problem that no alignment slits are formed at leeward sides of the elements to the alignment direction by forming the first alignment slits and the second alignment slits which provide particularly high surface anchoring energies such that the LC molecules in the LCD layer are arranged in the predetermined direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating a manufacturing method for a TFT array substrate provided by a first preferred embodiment of the present invention, wherein FIG. 2 is a top view of the preferred embodiment, and FIGS. 3-6 are cross-sectional views taken along A-A' of FIG. 2.

FIGS. 7-10 are schematic drawings illustrating a manufacturing method for a TFT array substrate provided by a second preferred embodiment of the present invention, wherein FIG. 7 is a top view of the preferred embodiment, and FIGS. 8-10 are cross-sectional views taken along B-B' of FIG. 7.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
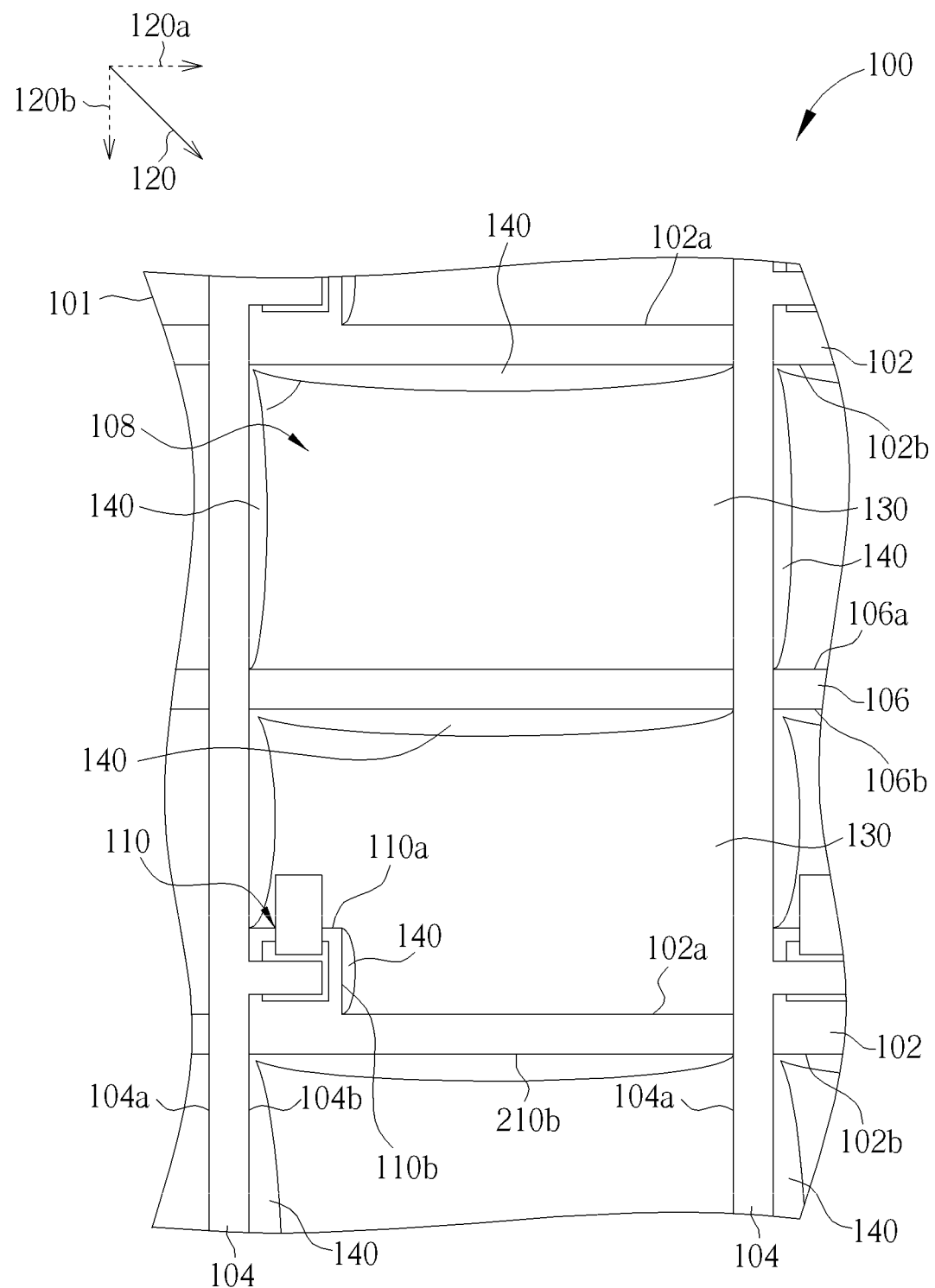
FIG. 1 is a schematic drawing illustrating a conventional TFT array substrate of a TN LCD.
Figure 2:
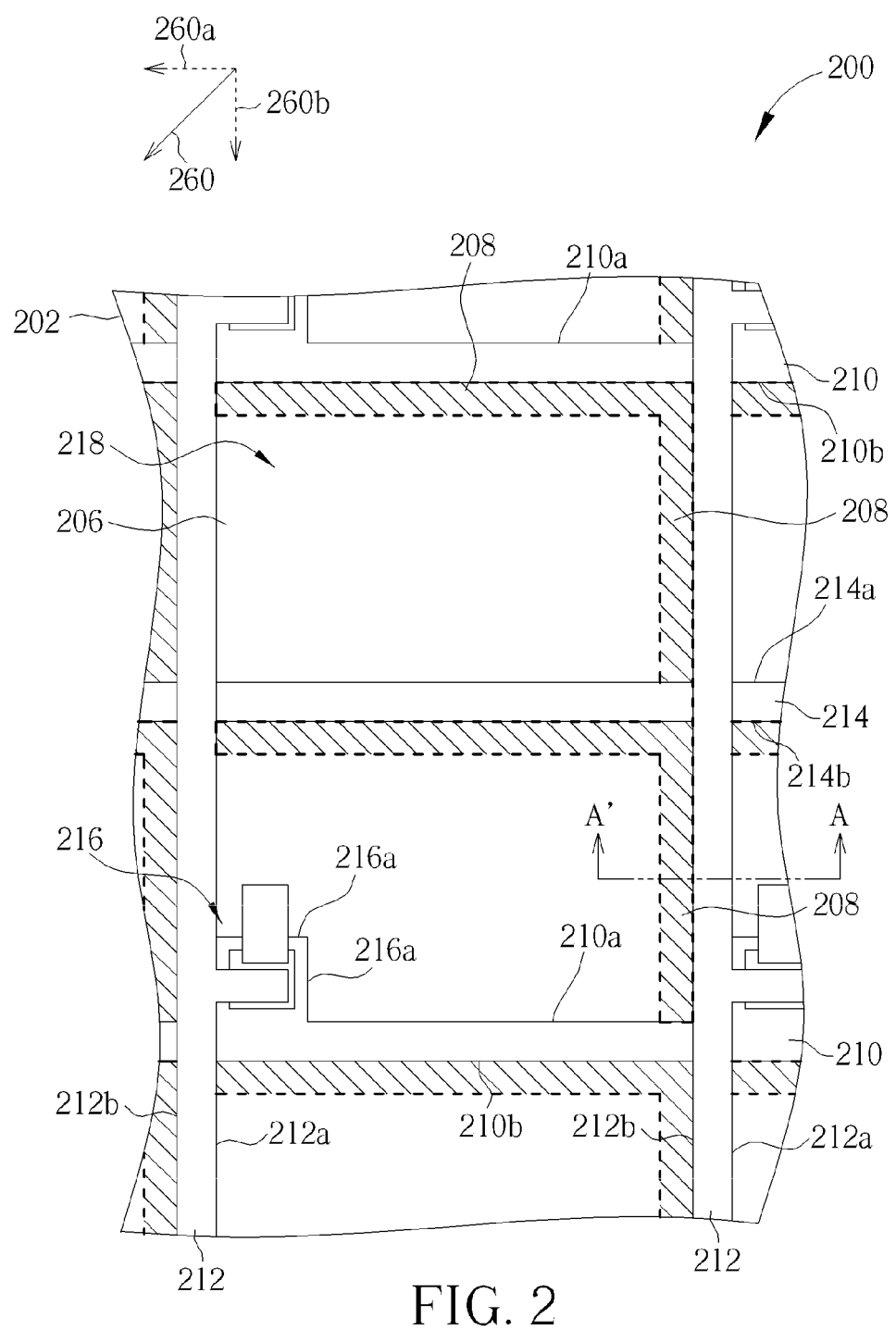
Figure 3:
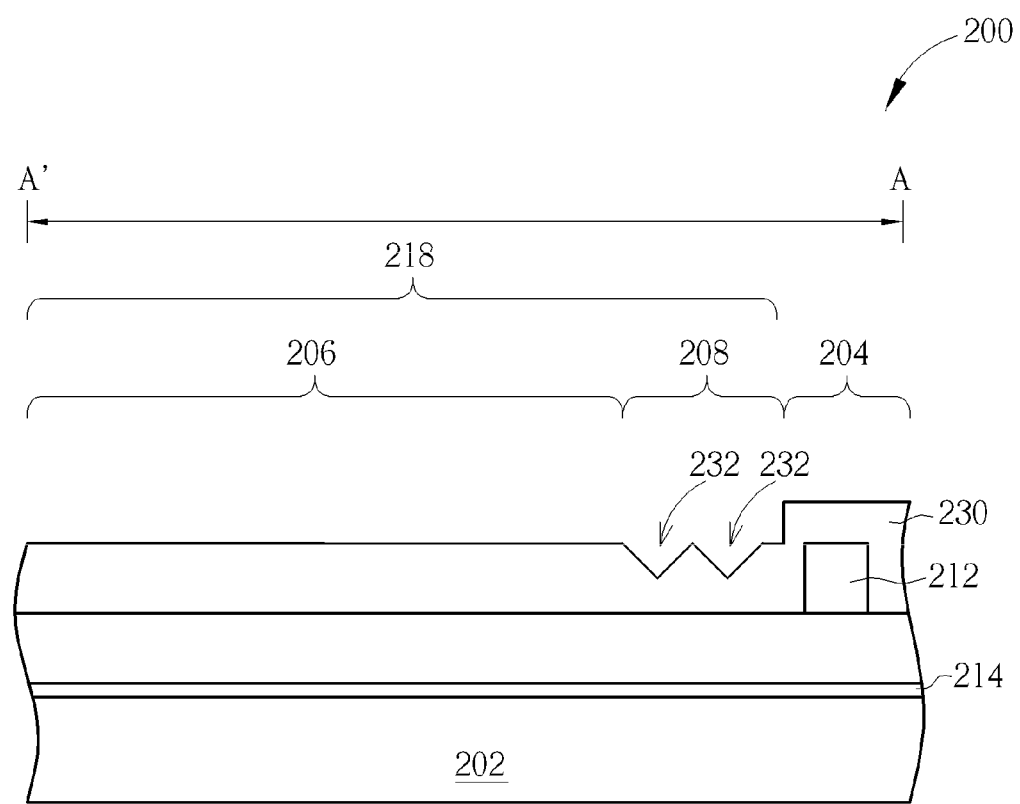

Please refer to FIGS. 2-6, which are schematic drawings illustrating a manufacturing method for a TFT array substrate provided by a first preferred embodiment of the present invention, wherein FIG. 2 is a top view of the preferred embodiment, and FIGS. 3-6 are cross-sectional views taken along A-A' of FIG. 2. As shown in FIG. 2 and FIG. 3, the preferred embodiment provides a substrate 202 having a plurality of scan lines 210, a plurality of data lines 212, a plurality of storage electrode lines 214, and a plurality of switch devices 216 such as TFTs necessary for a TFT array substrate 200 formed thereon. The scan lines 210 and the data lines 212 define a plurality of pixel regions 218 on the substrate 202, and the switch devices 216 are respectively formed in each of the pixel regions 218. Furthermore, where the scan lines 210, the data lines 212, the storage electrode lines 214 and the switch devices 216 are formed is defined as a device region 204 (shown in FIG. 3) according to the referred embodiment.

It is noteworthy that when manufacturing the TFT array substrate, an alignment direction 260 used in the rubbing alignment process has been acknowledged already, therefore relativities between the scan lines 210, the data lines 212, the storage electrode lines 214 and the switch devices 216 and the alignment direction 260 are consequently obtained. For example, being perpendicular to a first component direction 260a of the alignment direction 260, the data line 212 has a data line windward side 212a and a data line leeward side 212b, and the switch device 216 has a switch device windward side 216a. In the same concept, be perpendicular to a second component direction 260b of the alignment direction 260, the scan line 210 has a scan line windward side 210a and a scan line leeward side 210b, the storage electrode line 214 has a storage electrode line windward side 214a and a storage electrode line leeward side 214b, and the switch device 216 has a switch device windward side 216a. In other words, elements in the device region 204 all obtain a windward side and a leeward side corresponding to the alignment direction 260. According to the preferred embodiment, a plurality of normal alignment regions 206 is defined at all the windward sides in the pixel region 218, such as at the scan line windward side 210a, the storage electrode line windward side 214a, the data line windward side 212a and the switch devices windward side 216a, and a plurality of abnormal alignment regions 208 is defined at all the leeward sides such as the scan line leeward side 210b, the storage electrode line leeward side 214b, and the data line leeward sides 212b. Briefly speaking, the preferred embodiment defines the normal alignment regions 206 at a side of the scan lines 210, the data lines 212, the storage electrode lines 214 and the switch devices 216, and defines the abnormal alignment regions 208 at an opposite side of the scan lines 210, the data lines 212, the storage electrode lines 214, and the switch devices 216.

Please still refer to FIG. 2 and FIG. 3. After forming the scan lines 210, the data lines 212, the storage electrode lines 214 and the switch devices 216, an insulating layer 230 covering the scan lines 210, the data lines 212, the storage electrode lines 214 and the switch devices 216 is formed on the substrate 202 and followed by performing a patterning process. Consequently, a contact hole (not shown) for electrically connecting the pixel electrode and the drain of the switch device 216 is formed in the insulating layer 230. It is noteworthy that a halftone photomask is used in the patterning process in the preferred embodiment. Accordingly, a plurality of alignment structures 232 is formed in the surface of the insulating layer 230 in each of the abnormal alignment regions 208. Furthermore, it is well-known to those skilled in the art that not only the alignment direction 260 has been acknowledged before performing the rubbing alignment process, but also a predetermined slit depth and a predetermined slit width have been acknowledged. Therefore, a depth and a width of the alignment structures 232 are both formed larger than the predetermined slit depth and the predetermined slit width.

Figure 4:
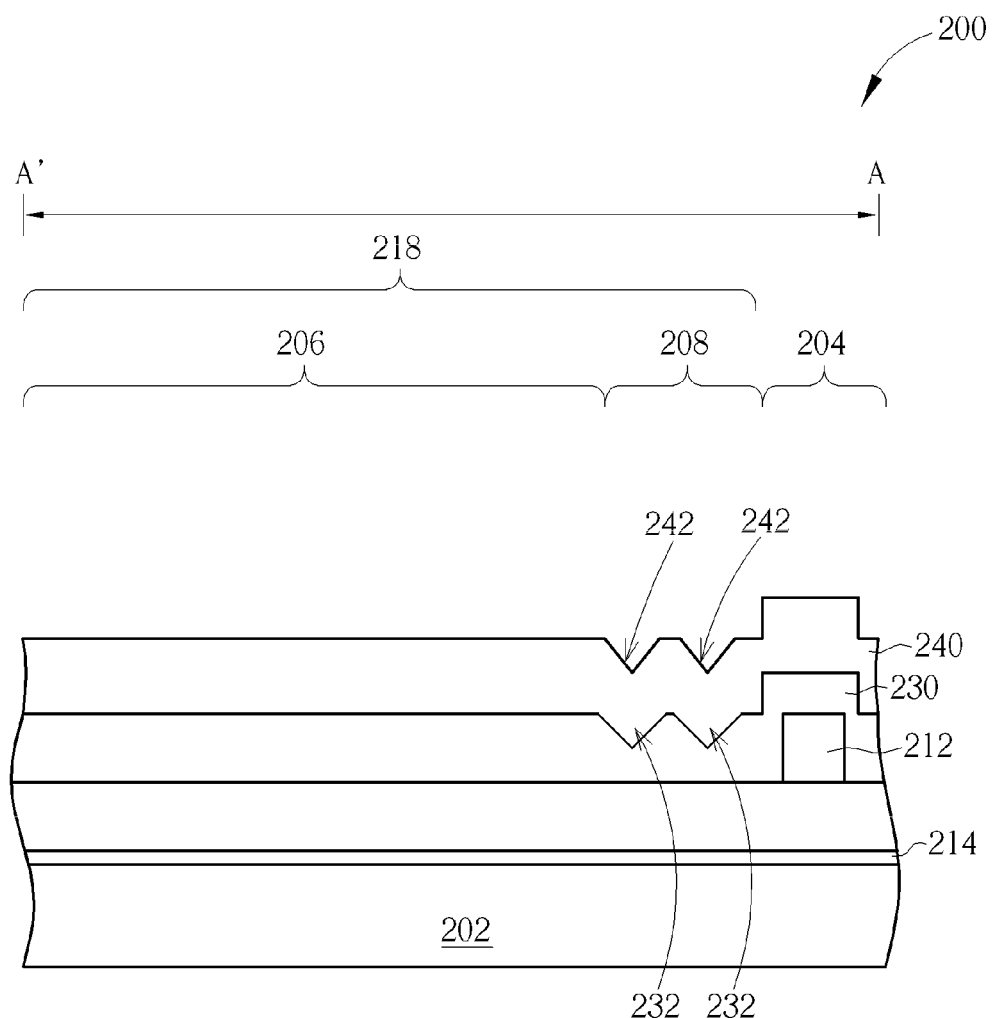

Please refer to FIG. 4. After forming the alignment structures 232, a transparent conductive layer (not shown) is formed on the substrate 202 and followed by performing another patterning process. Consequently, a pixel electrode 240 is respectively formed in each pixel region 218. It is noticeable that the pixel electrode 240 covers the insulating layer 230 in the normal alignment region 206 and the alignment structures 232 in the abnormal alignment region 208. Consequently, a plurality of third alignment slits 242 is formed along the surface of the alignment structures 232 in the pixel electrode 240 in each of the abnormal alignment regions 208. And a depth and a width of the third alignment slits 242 are both smaller than the depth and the width of the alignment structures 232 but still larger than the predetermined slit depth and the predetermined slit width.

Figure 5:
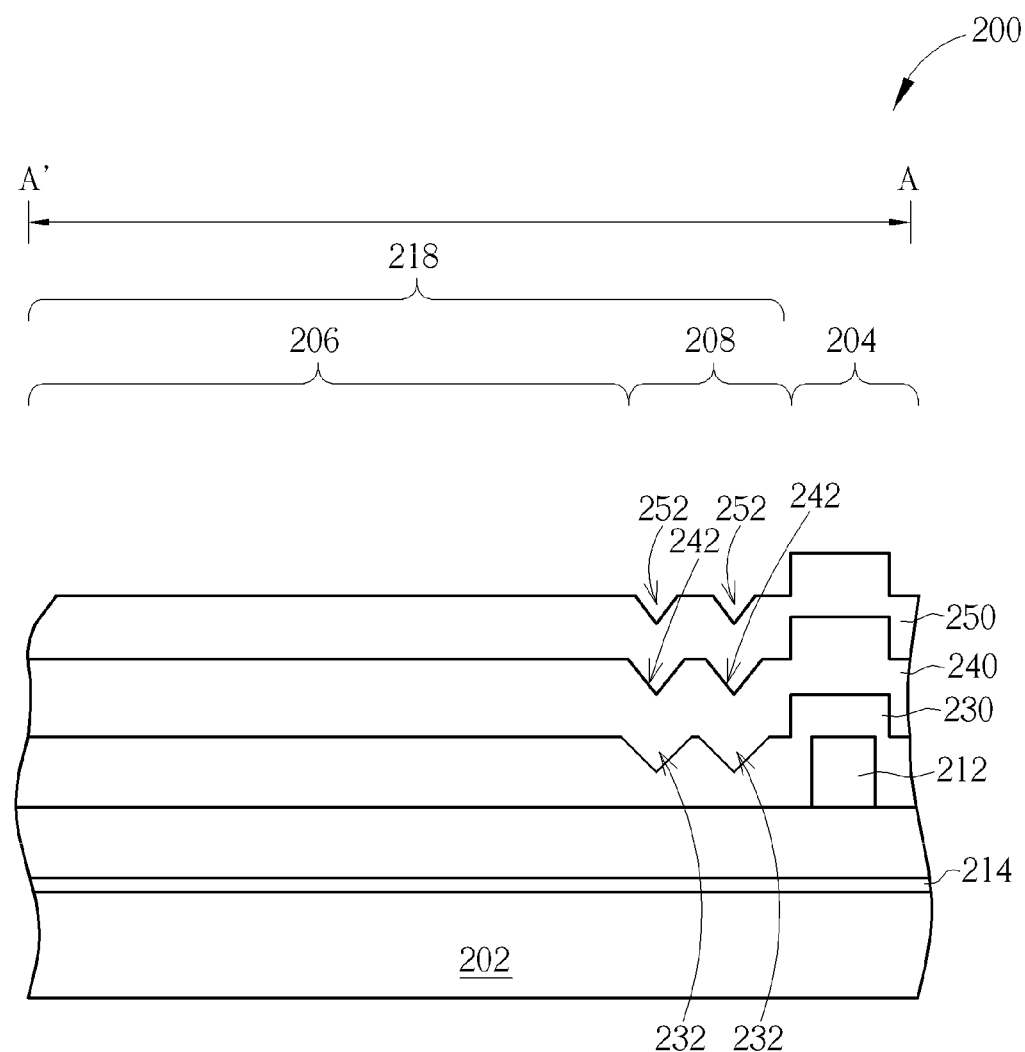

Please refer to FIG. 5. Next, an alignment material layer 250 is formed on the substrate 202 and the alignment structures 232. It is noteworthy that a plurality of first alignment slits 252 is formed along the third alignment slits 242 in the alignment material layer 250 in each of the abnormal alignment regions 208. In other word, the first alignment slits 252 are directly formed on the third alignment slits 242. However, the alignment material layer 250 in the normal alignment regions 206 still has an intact and even surface. It is noticeable that a depth and a width of the first alignment slits 252 are both smaller than the depths and the widths of the third alignment slits 242 and the alignment structures 232, but the depth and the width of the alignment slits 252 are equal to the predetermined slit depth and the predetermined slit width.

Figure 6:
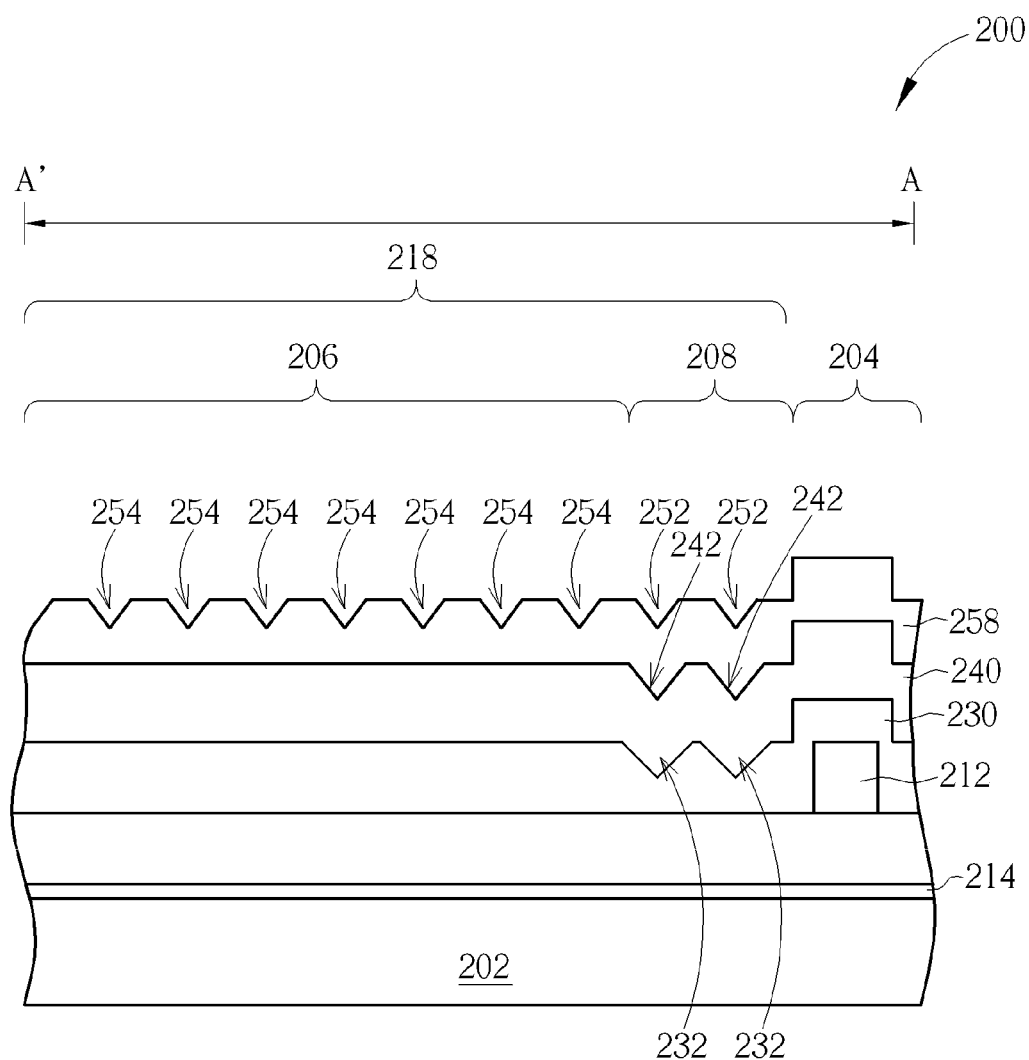

Please refer to FIG. 2 and FIG. 6. After forming the alignment material layer 250 and the first alignment slits 252, a rubbing alignment process is performed to the alignment material layer 250 along the alignment direction 260. As mentioned above, since a grid pattern formed by the scan lines 210, the data lines 212 and the storage electrode lines 214 is protruded from the TFT array substrate 200, the rubbing roll forms a plurality of second alignment slits 254 only in the normal alignment regions 206 but no second alignment slits 254 can be formed at the scan line leeward side 210b, the data line leeward side 212b, the storage electrode line leeward side 214b by the rubbing roll. Though no second alignment slits 254 are formed by the rubbing roll, the alignment material layer 250 still obtains the first alignment slits 252 formed along the alignment structures 232 in the abnormal alignment regions 208. And the depth and the width of the first alignment slits 252 are equal to a depth and a width of the second alignment slits 254. In other words, an alignment layer 258 is obtained after performing the rubbing alignment process, and the alignment layer 258 has the second alignment slits 254 in the normal alignment regions 206 and the first alignment slits 252 in the abnormal alignment regions 208.

According to the first preferred embodiment, the abnormal alignment regions 208 and the normal alignment regions 206 are defined in the pixel regions 218 corresponding to the alignment direction 260. Then, the alignment structures 232 having the depth and the width larger than the predetermined slit depth and the predetermined slit width are formed in the insulating layer 230 in the abnormal alignment regions 208. Accordingly, the alignment material layer 250 spontaneously obtains the first alignment slits 252 having the depth and the width equal to the predetermined slit width and the predetermined slit depth formed along the surface of the alignment structures 232 in the abnormal alignment regions 208. The alignment material layer 250 further obtains the second alignment slits 254 having the predetermined slit width and the predetermined slit depth in the normal alignment regions 206 by performing the rubbing alignment process. Accordingly, the first preferred embodiment provides an alignment layer 258 having the first alignment slits 252 in the abnormal alignment regions 208 and the second alignment slits 254 in the normal alignment regions 206. And the first alignment slits 252 and the second alignment slits 254 have the identical depths and widths. Furthermore, since the alignment structures 232 are formed by the patterning process used to form the contact hole, no extra process is further needed according to the preferred embodiment. In other words, the first preferred embodiment solves the problem that no alignment slits are formed at the leeward sides to the alignment direction by providing the first alignment slits 252 and the second alignment slits 254 with identical widths and depths in the pixel regions 218 such that a particularly high surface anchoring energy is provided, and thus the LC molecules in the LCD layer are arranged in the predetermined direction.

Figure 7:
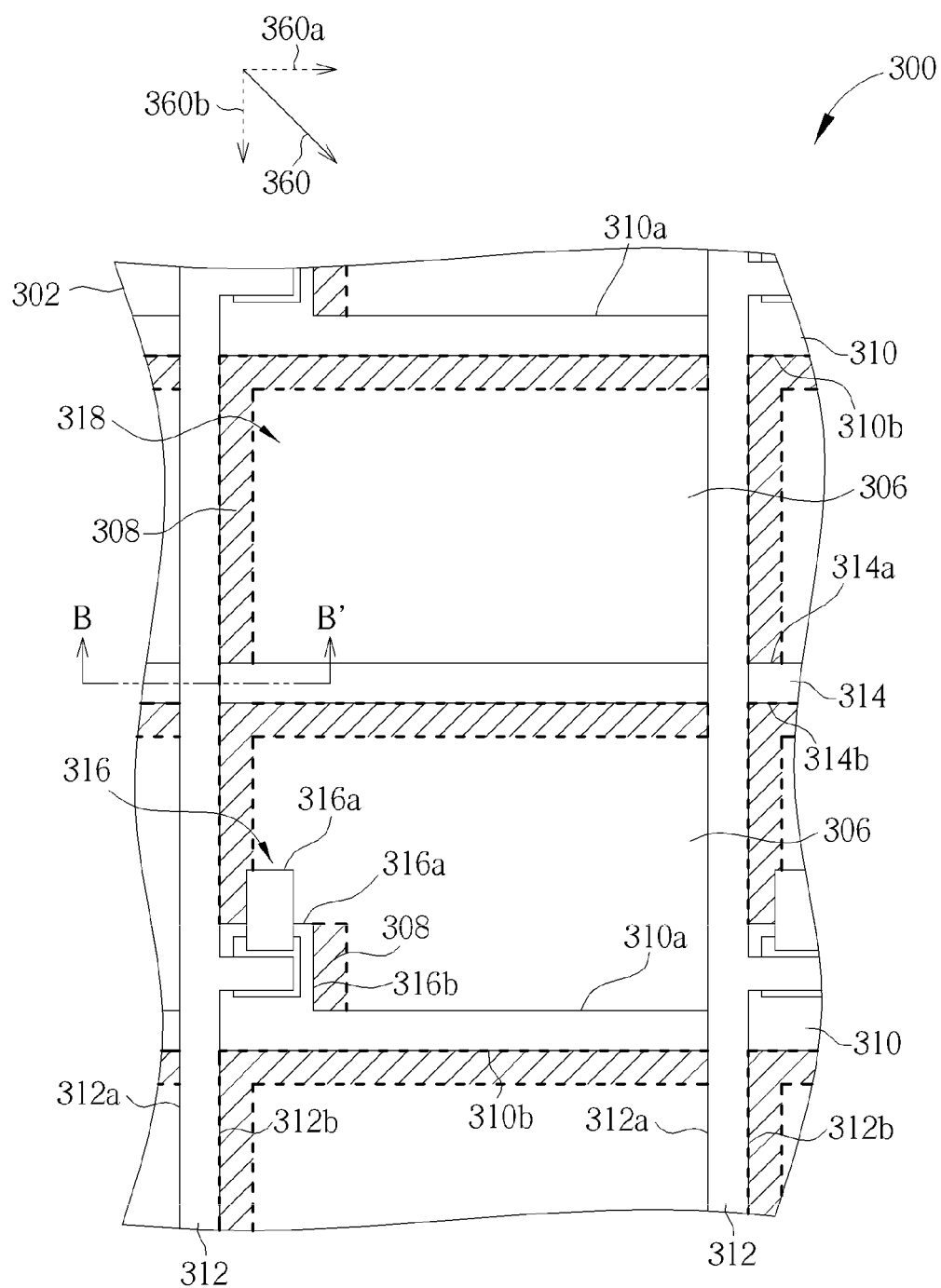
Figure 8:
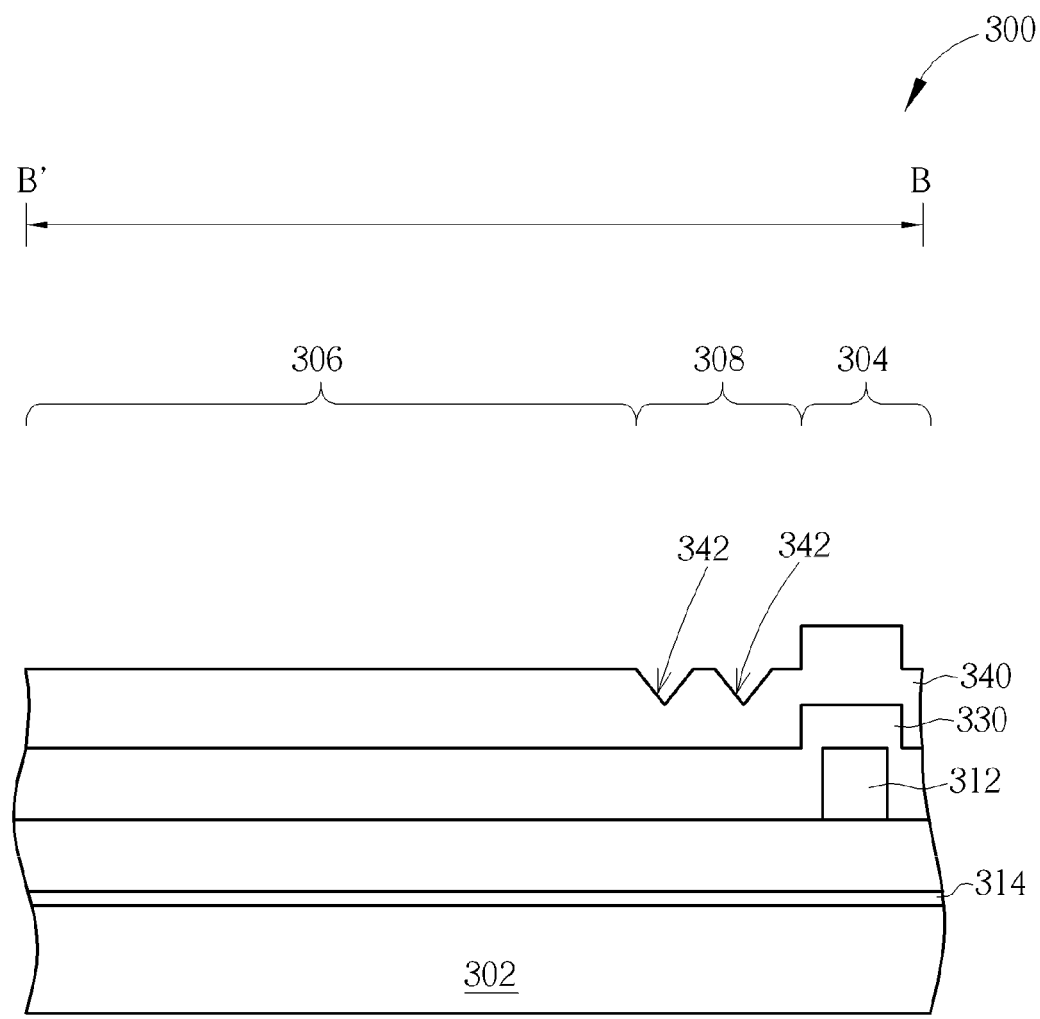
Figure 9:
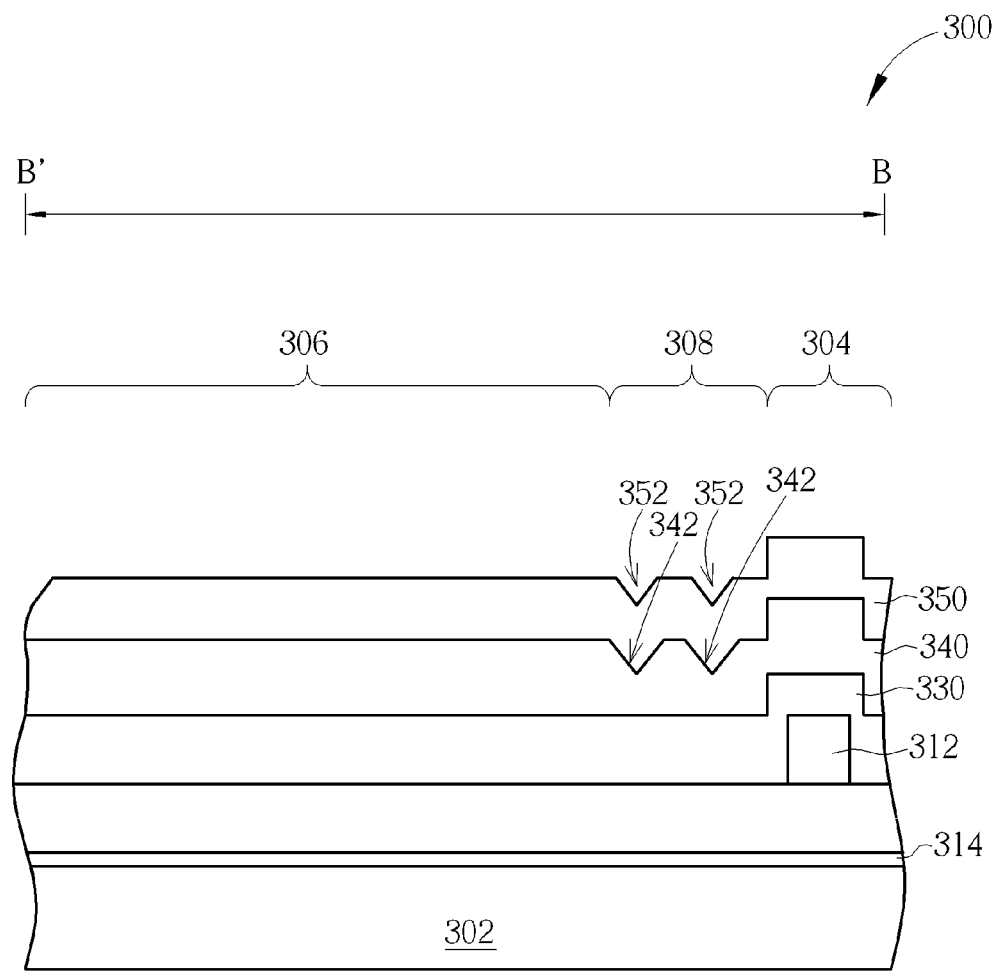
Figure 10:
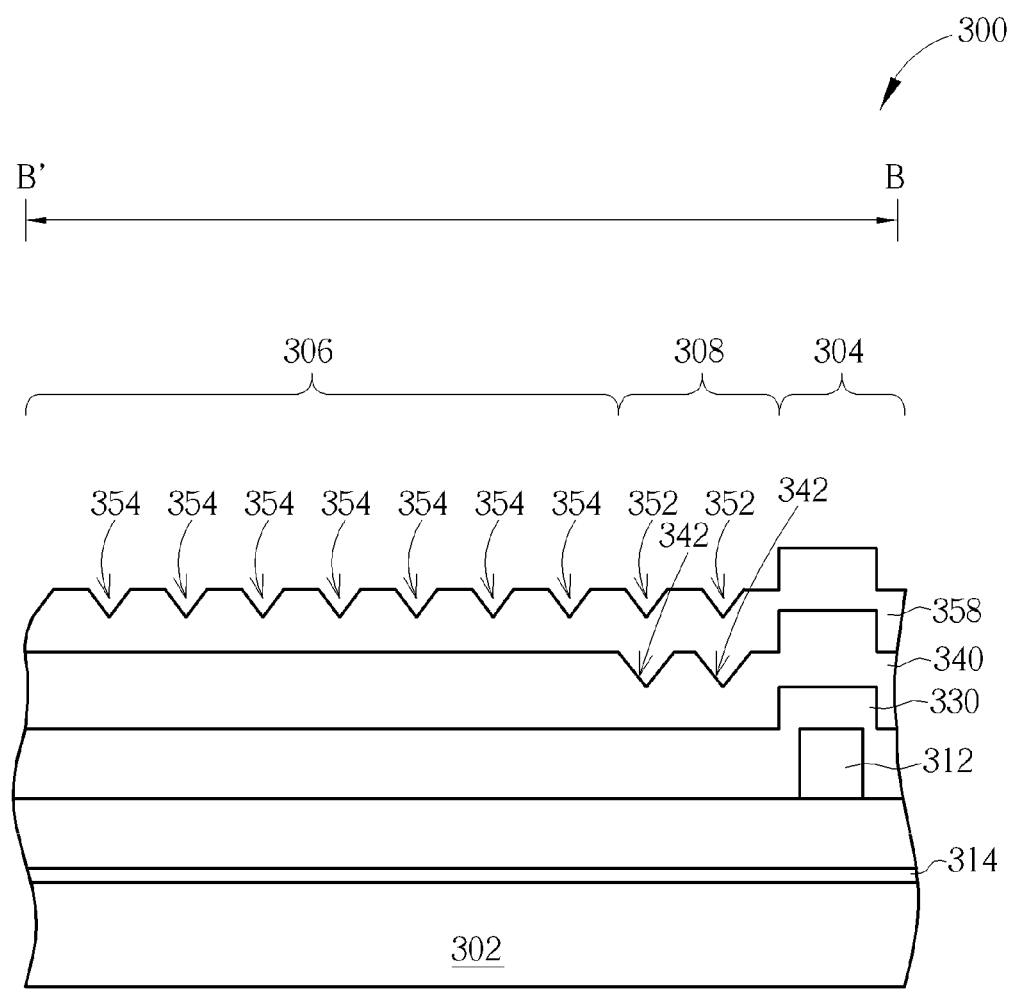

Please refer to FIGS. 7-10, which are schematic drawings illustrating a manufacturing method for a TFT array substrate provided by a second preferred embodiment of the present invention, wherein FIG. 7 is a top view of the preferred embodiment, and FIGS. 8-10 are cross-sectional views taken along B-B' of FIG. 7. As shown in FIG. 7 and FIG. 8, the preferred embodiment provides a substrate 302 having a plurality of scan lines 310, a plurality of data lines 312, a plurality of storage electrode lines 314, and a plurality of switch devices 316 such as TFTs formed thereon. The scan lines 310 and the data lines 312 define a plurality of pixel regions 318 on the substrate 302, and the switch devices 316 are respectively formed in each of the pixel regions 318. Furthermore, where the scan lines 310, the data lines 312, the storage electrode lines 314 and the switch devices 316 are formed is defined as device region 304 (shown in FIG. 8) according to the preferred embodiment.

As mentioned above that when manufacturing the TFT array substrate 300, an alignment direction 360 used in the rubbing alignment process has been acknowledged already, therefore relativities between the scan lines 310, the data lines 312, the storage electrode lines 314 and the switch devices 316 and the alignment direction 360 are consequently obtained. For example, being perpendicular to a first component direction 360a of the alignment direction 360, the data line 312 has a data line windward side 312a and a data line leeward side 312b, and the switch device 316 has a switch device leeward side 316b. In the same concept, be perpendicular to a second component direction 360b of the alignment direction 360, the scan line 310 has a scan line windward side 310a and a scan line leeward side 310b, the storage electrode line 314 has a storage electrode line windward side 314a and a storage electrode line leeward side 314b, and the switch device 316 has a switch device windward side 316a. In other words, elements in the device region 304 all obtain a windward side and a leeward side corresponding to the alignment direction 360. According to the preferred embodiment, a plurality of normal alignment regions 306 is defined at all the windward sides in the pixel region 318, such as at the scan line windward side 310a, the storage electrode line windward side 314a, the data line windward side 312a and the switch devices windward side 316a, and a plurality of abnormal alignment regions 308 is defined at all the leeward sides such as the scan line leeward side 310b, the storage electrode line leeward side 314b, the data line leeward sides 312b and the switch device leeward side 316b. Briefly speaking, the preferred embodiment defines the normal alignment regions 306 at a side of the scan lines 310, the data lines 312, the storage electrode lines 314 and the switch devices 316, and defines the abnormal alignment regions 308 at an opposite side of the scan lines 310, the data lines 312, the storage electrode lines 314, and the switch devices 316.

Please refer to FIG. 7 and FIG. 8. After forming the scan lines 310, the data lines 312, the storage electrode lines 314 and the switch devices 316, an insulating layer 330 is formed on the substrate 302 and followed by performing a patterning process to form a contact hole (not shown). Subsequently, a transparent conductive layer (not shown) is formed. As show in FIG. 8, after forming the transparent conductive layer, a patterning process is performed to pattern the transparent conductive layer and thus a pixel electrode 340 is respectively formed in each pixel region 318. It is noteworthy that a halftone photomask is used in the patterning process in the preferred embodiment. Accordingly, a plurality of alignment structures 342 is formed in the surface of transparent conductive layer in each of the abnormal alignment regions 308. Furthermore, it is well-known to those skilled in the art that not only the alignment direction 360 has been acknowledged before performing the rubbing alignment process, but also a predetermined slit depth and a predetermined slit width have been acknowledged. Therefore, a depth and a width of the alignment structures 342 are both formed larger than the predetermined slit depth and the predetermined slit width.

Please refer to FIG. 9. After forming the pixel electrodes 340 and the alignment structures 342, an alignment material layer 350 is formed on the substrate 302. It is noticeable that a plurality of first alignment slits 352 is formed along the alignment structures 342 in the alignment material layer 350 in the abnormal alignment region 308. In other words, the first alignment slits 352 are directly formed on the alignment structures 342. However, the alignment material layer 350 still has an intact and even surface in the normal alignment region 306. Furthermore, a depth and a width of the first alignment slits 352 are both smaller than the depth and the width of the alignment structures 342, but the depth and the width of the first alignment slits 352 are equal to the predetermined slit depth and the predetermined slit width.

Please refer to FIG. 7 and FIG. 10. After forming the alignment material layer 350 and the first alignment slits 352, a rubbing alignment process is performed to the alignment material layer 350 along the alignment direction 360. As mentioned above, since a grid pattern formed by the scan lines 310, the data lines 312 and the storage electrode lines 314 is protruded from the TFT array substrate 300, the rubbing roll forms a plurality of second alignment slits 354 only in each of the normal alignment regions 306 but no second alignment slits 354 can be formed at the scan line leeward side 310b, the data line leeward side 312b, the storage electrode line leeward side 314b and the switch device leeward side 316b by the rubbing roll. Though no second alignment slits 354 are formed by the rubbing roll in the abnormal alignment region 308, the alignment material layer 350 still obtains the first alignment slits 352 formed along the alignment structures 342 in the abnormal alignment region 308 without rubbing alignment process. And the depth and the width of the first alignment slits 352 are identical to a depth and a width of the second alignment slits 354. In other words, an alignment layer 358 is obtained after performing the rubbing alignment process, and the alignment layer 358 has the second alignment slits 354 in the normal alignment region 306 and has the first alignment slits 352 in the abnormal alignment region 308.

According to the second preferred embodiment, the abnormal alignment regions 308 and the normal alignment regions 306 are defined in the pixel regions 318 corresponding to the alignment direction 360. Then, the alignment structures 342 having the depth and the width larger than the predetermined slit depth and the predetermined slit width are formed in the pixel electrodes 340 in the abnormal alignment regions 308 by using the halftone photomask. Accordingly, the alignment material layer 350 spontaneously obtains the first alignment slits 352 having the depth and the width equal to the predetermined slit width and the predetermined slit depth along the surface of the alignment structures 342. The alignment material layer 350 further obtains the second alignment slits 354 having the predetermined slit width and the predetermined slit depth in the normal alignment regions 306 by performing the rubbing alignment process. Accordingly, the second preferred embodiment provides an alignment layer 358 having the first alignment slits 352 in the abnormal alignment regions 308 and the second alignment slits 354 in the normal alignment regions 306. And the first alignment slits 352 and the second alignment slits 354 have the identical depths and widths. Furthermore, since the alignment structures 342 are formed by the patterning process used to form the pixel electrodes 340, no extra process is further needed according to the preferred embodiment. In other words, the second preferred embodiment solves the problem that no alignment slits are formed at leeward sides to the alignment direction by providing the first alignment slits 352 and the second alignment slits 354 with identical width and depth in the pixel regions 318 such that a particularly high surface anchoring energy is provided and thus the LC molecules in the LCD layer are arranged in the predetermined direction.

According to the TFT array substrate and the manufacturing method thereof provided by the present invention, the abnormal alignment regions and the normal alignment regions are particularly defined on the substrate according to an alignment direction, and the alignment structures are particularly formed in the insulating layer or the transparent conductive layer in the abnormal alignment regions by the patterning process. Therefore, the alignment material layer spontaneously obtains the first alignment slits along the alignment structure in the abnormal alignment regions while the second alignment slits are formed in the alignment material layer in the normal alignment regions after performing the rubbing alignment process. And the depths and the widths of the first alignment slits and the second alignment slits are the same. Furthermore, since the alignment structures are formed by the patterning process used to form the contact holes or the pixel electrodes, no extra patterning process is further needed according to the present invention. Accordingly, the TFT array substrate and the manufacturing method thereof provided by the present invention solve the problem that no alignment slits are formed at leeward sides to the alignment direction by forming the first alignment slits and the second alignment slits which provide particularly high surface anchoring energies such that the LC molecules in the LCD layer are arranged in the predetermined direction. In addition, the black matrix that conventionally used to shield the abnormal alignment regions is eliminated and the problem of lower aperture ratio is therefore solved. Furthermore, the TFT array substrate and the manufacturing method thereof provided by the present invention can be used in not only the TN LCD apparatus but also other type LCD apparatus such as in-plane switching (IPS) LCD apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a thin film transistor (TFT) array substrate, comprising:
   providing a substrate having a plurality of scan lines, a plurality of data lines, a plurality of storage electrode lines, and a plurality of switch devices formed thereon;
   defining a plurality of normal alignment regions and a plurality of abnormal alignment regions on the substrate; wherein the normal alignment regions are defined at sides of the scan lines, the data lines, the storage electrode line, and the switch devices, and the abnormal alignment regions are defined at opposite sides of the scan lines, the data lines, the storage electrode lines, and the switch devices;
   forming an insulating layer and a transparent conductive layer on the substrate, sequentially;
   performing a patterning process to at least one of the insulating layer and the transparent conductive layer to form a plurality of alignment structures in each abnormal alignment region;
   forming an alignment material layer on the substrate, the alignment material layer having a plurality of first alignment slits formed along the alignment structures in each of the abnormal alignment regions; and
   performing a rubbing alignment process to form a plurality of second alignment slits in the alignment material layer in each of the normal alignment regions along an alignment direction.

2. The manufacturing method for a TFT array substrate according to claim 1, wherein the patterning process is performed to form the alignment structures in the insulating layer in the abnormal alignment regions.

3. The manufacturing method for a TFT array substrate according to claim 2, wherein the transparent conductive layer covers the insulating layer and the alignment structures, and a plurality of third alignment slits is formed along the alignment structures in the transparent conductive layer in each of the abnormal alignment regions.

4. The manufacturing method for a TFT array substrate according to claim 3, wherein the first alignment slits are directly formed on the third alignment slits.

5. The manufacturing method for a TFT array substrate according to claim 1, wherein the patterning process is performed to form the alignment structures in the transparent conductive layer in the abnormal alignment regions.

6. The manufacturing method for a TFT array substrate according to claim 5, wherein the first alignment slits are directly formed on the alignment structures.

7. The manufacturing method for a TFT array substrate according to claim 1, wherein the patterning process further includes using a half-tone photomask to form the alignment structures.

8. The manufacturing method for a TFT array substrate according to claim 1, wherein a depth and a width of the first alignment slits are equal to a depth and a width of the second alignment slits.

9. The manufacturing method for a TFT array substrate according to claim 8, wherein a depth and a width of the alignment structures are larger than the depth and the width of the first alignment slits.

10. The manufacturing method for a TFT array substrate according to claim 1, wherein the normal alignment regions are respectively defined at a windward side of the scan lines corresponding to the alignment direction, at a windward side of the data lines corresponding to the alignment direction, at a windward side of the storage electrode lines corresponding to the alignment direction, and a windward side of the switch devices corresponding to the alignment direction.

11. The manufacturing method for a TFT array substrate according to claim 1, wherein the abnormal alignment regions are respectively defined at a leeward side of the scan lines corresponding to the alignment direction, at a leeward side of the data lines corresponding to the alignment direction, at a leeward side of the storage electrode lines corresponding to the alignment direction, and at a leeward side of the switch devices corresponding to the alignment direction.

* * * * *